(12) United States Patent
Haag et al.

(10) Patent No.: US 6,447,082 B1
(45) Date of Patent: Sep. 10, 2002

(54) SUBRACK

(75) Inventors: Volker Haag, Bad Wildbad (DE); Michael Joist, Gaggenau (DE); Klaus Kern, Straubenhardt (DE); Paul Mazura, Karlsbad (DE)

(73) Assignee: Schroff GmbH, Straubenhardt (DE)

( * ) Notice: Subject to any disclaimer, the term of this patent is extended or adjusted under 35 U.S.C. 154(b) by 0 days.

(21) Appl. No.: 09/673,200

(22) PCT Filed: Apr. 15, 1999

(86) PCT No.: PCT/EP99/02529

§ 371 (c)(1),
(2), (4) Date: Oct. 12, 2000

(87) PCT Pub. No.: WO99/55129

PCT Pub. Date: Oct. 28, 1999

(30) Foreign Application Priority Data

Apr. 17, 1998 (DE) .......................................... 198 17 089

(51) Int. Cl.[7] .............................................. A47B 47/02
(52) U.S. Cl. .................... 312/263; 312/223.2; 361/725; 361/726
(58) Field of Search .................. 361/725, 726, 361/728, 685; 312/257.1, 263, 265.5, 223.1, 223.2

(56) References Cited

U.S. PATENT DOCUMENTS

| 4,277,120 A | | 7/1981 | Drake et al. |
| 5,313,370 A | | 5/1994 | Schwenk et al. |
| 5,913,581 A | * | 6/1999 | Stephan et al. ......... 361/727 X |
| 6,027,191 A | * | 2/2000 | Korinsky et al. ....... 312/263 X |
| 6,097,608 A | * | 8/2000 | Berberich et al. ... 312/223.1 X |
| 6,227,632 B1 | * | 5/2001 | Liu ........................ 312/685 X |
| 6,362,975 B1 | * | 3/2002 | Liu et al. ................ 361/725 X |
| 6,377,449 B1 | * | 4/2002 | Liao et al. .............. 361/725 X |

FOREIGN PATENT DOCUMENTS

| DE | 31 40 760 A1 | 4/1983 |
| DE | 295 02 404 U1 | 3/1996 |
| DE | 195 23 964 A1 | 1/1997 |

* cited by examiner

Primary Examiner—John G. Weiss
Assistant Examiner—Michael J. Fisher
(74) Attorney, Agent, or Firm—Merchant & Gould P.C.

(57) ABSTRACT

The invention relates to a subrack (1) for industrial electronics. The front and/or rear edge of a cover sheet (4) and that of a base sheet (6) are formed by edge-folding for fixing a specially configured angular strip (12). This enables known module rails to be integrated with the cover or the base and means that said module rails can be produced from sheet steel, which significantly reduces the production costs.

13 Claims, 2 Drawing Sheets

Figure 1:
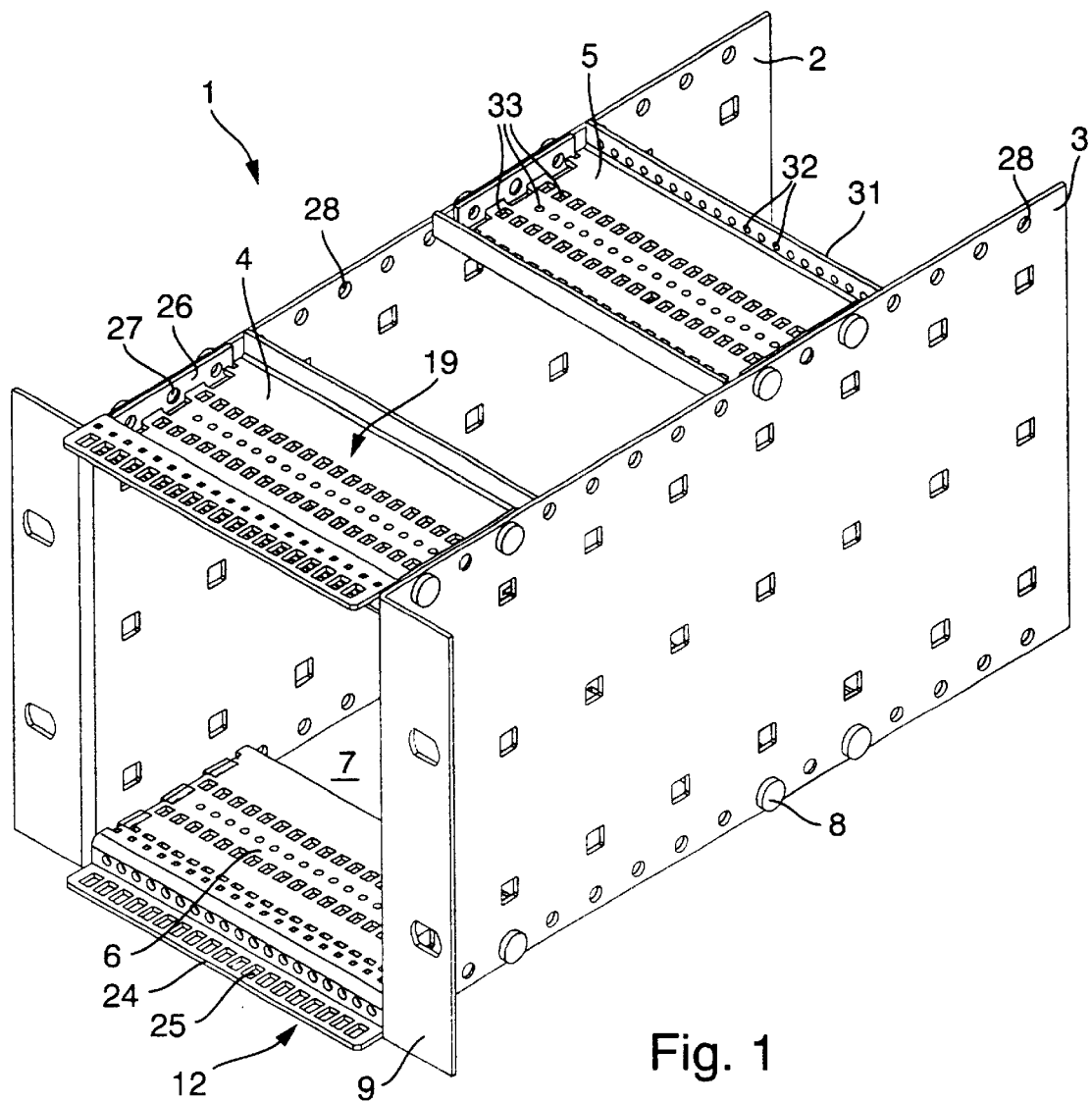

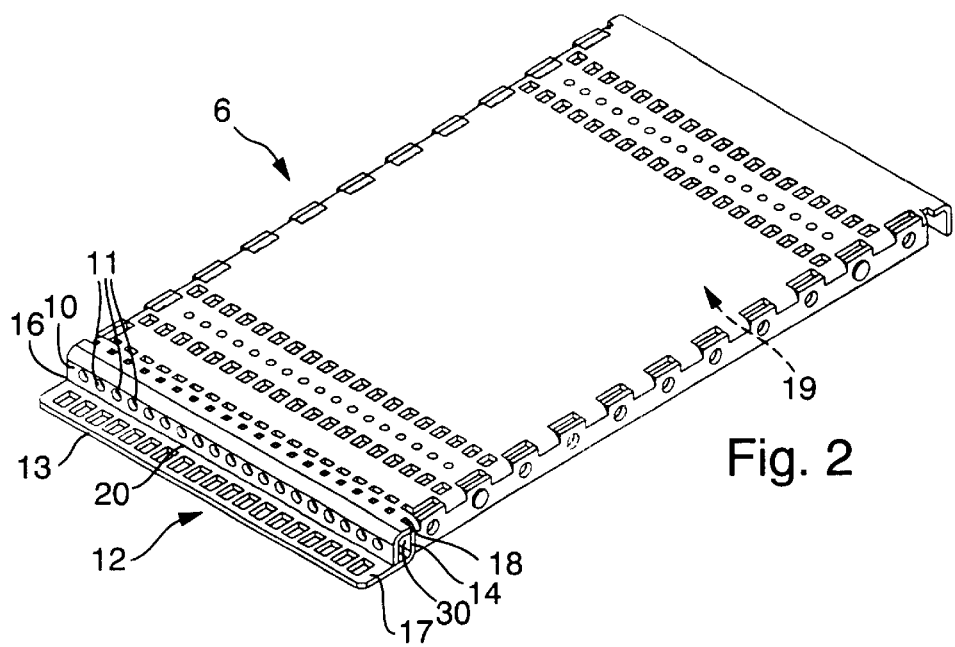
Fig. 2
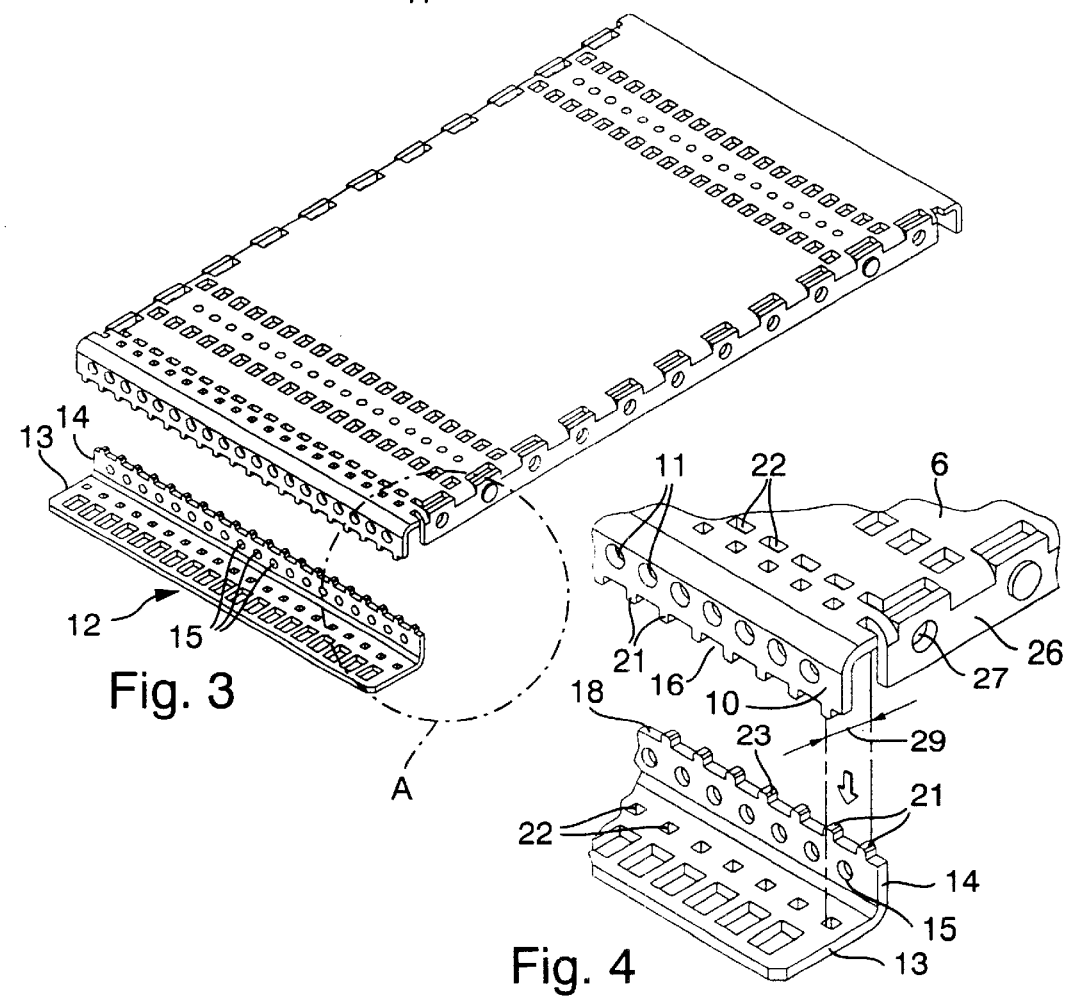
Fig. 3
Fig. 4

SUBRACK

The invention relates to a subrack with two side walls, with at least one cover plate as well as at least one bottom plate, wherein the cover plate and the bottom plate are fixed between the side walls, and the cover plate as well as the bottom plate display a bent section projecting at a right angle.

Subracks, as they serve the reception of insertable subassemblies fitted with electrical and electronic components, have long been known in the industry for a long time.

In the simplest implementation such a subrack consists of two side walls and four module rails with their facial surfaces on both sides screwed to the inner surfaces of the stamped—out side walls, the latter being of aluminum. A cover plate and a bottom plate as well as a back wall can allow the subrack to be a closed housing, from whose open front side the subassemblies are pushed onto the fitted guide rails. The subassemblies exhibit partial front plates that rest on the two forward module rails and are screwed in above and below. Devices for insertion and withdrawal, which connect to the module rails, complete the subrack.

The module rails required for the subrack—in order to satisfy all the requirements for fastening the partial front plate and the guide rails—exhibit a more or less elaborately formed profile; therefore they consist of extruded aluminum. Complicated tools are required for production of these module rails, whose manufacture is thus expensive. Attempts to produce the module rails through multiple bendings of strips of sheet steel have failed up to now because the awkward large bending radii do not allow the required sharp-edged transitions of neighboring surfaces. This is where the invention comes into effect.

To be sure, a housing is known for receiving of insertable subassemblies (U.S. Pat. No. 4,277,120) that exhibits two side walls, a cover plate and a bottom plate, wherein the cover plate carries a bent section projecting at a right angle that serves the fixing of a lower U-rail for insertion of label strips.

With another known subrack, provision is made for the connection of module rails to the side walls, a cover plate and a bottom plate, which in each case are fabricated of two U-rails of different width that engage one another. Serving the connecting of the latter are sheet metal carriers projecting at the inner rail, the carriers engaging in slots in the bracing of the outer, wider U-rail (DE-OS 195 23 964).

A known cost-effectively producible subrack possesses two side walls that can be stuck together with the cover part and the bottom part. For this, the sides carry meandering punched-out edges, whose fingers engage in trapezoidal stamped-out bulges that are provided at inwardly projecting bent sections of the cover and bottom (DE 295 02 404). Front side and backside transverse bars are formed through multiple bendings of the bottom part and the cover part.

The object of the invention consists in the concept of an especially cost-effectively producible subrack.

Proceeding as a starting point from a known subrack as described in the introduction, the object is achieved through the following constructive measures, namely: an angled strip is placed, in each case, on the cover plate or, as the case may be, on the bottom plate parallel to the bent section [of the top plate or the bottom plate]. The angled strip possesses a wide leg and a narrow leg bent at a right angle, the narrow leg carrying a series of threaded holes. The bent section is situated with its longitudinal edge against the inside of the wide leg; the narrow leg is situated with its outer edge against the outside of the cover plate or the bottom plate, as the case may be. The bent section exhibits a series of holes that are aligned with the threaded holes, and along the longitudinal edge of the bent section and the outer edge provision is made for connecting means.

Provision is made for several parallel rows of rectangular and circular holes and openings for receiving the fastening means of insertable guide rails.

With the proposed subrack there are no longer any separate module rails, rather these are integrated components of the cover plate and the bottom plate. The production of the designed angled strip intended for mounting on the front edges or the rear edges of the cover plate or the bottom plate can be produced with no problem in the context of sheet-metal processing through shearing, bending and hole punching. The same is true for the associated formation of the bent section of the cover plate and the bottom plate. The abutting edge between the bent section of the cover plate or the bottom plate and the wide leg of the angled strip is sharp edged. This allows a flawless mounting of the partial front plate of the inserted subassemblies. In contrast to extruded aluminum profiles for separate module rails, there is a crucial simplification and a lowering of cost of the essential parts of a subrack.

Appropriately, the cover plate, the bottom plate as well as the angled strip consist of equal-thickness corrosion-protected sheet steel. This serves the simplification of production.

At least some of the holes of the bent section are designed as alignment holes. Engaging these are positioning pins projecting from the rear side of the partial front plate.

Advantageously, the wide leg of the angled strip forms a prominent projection in which provision is made for rectangular openings in a row. This projection (usually described as a "roof") serves along with the rectangular openings as an abutment for the insertion and withdrawal devices on the subassemblies.

According to an important feature of the development of the invention, protruding along the outer edge of the narrow leg as a connecting means is a first row of tines that engage a first row of receptacles in the cover plate or the bottom plate.

In addition, for increasing the firmness of the connection of the angled strip to the cover plate or the bottom plate, as a connecting means along the bent section of the cover plate or the bottom plate, a second row of tines protrudes, the latter engaging a second row of receptacles in the wide leg of the angled strip.

Advantageously, the row of tines is arranged in each case slightly displaced with respect to the row of receptacles, so that a good, reliable clamping connection is achieved in the joining of the parts.

Through a pressing down by means of a tool of the upper side of tines situated in the receptacles as in a riveting process, the firmness of the connection can be increased still more.

Instead of the connection by means of dovetails engaging the receptacles, provisions can be made for only an adhesive. This makes unnecessary the production of tines or receptacles by a stamping of the components to be connected, so that costs can be additionally reduced. Any other known fastening method can be used for connection along the outer edge of the narrow leg and the bent section of the cover plate and the bottom plate.

Appropriately, the cover plate and the bottom plate exhibit at their side edges brackets protruding at a right angle, the brackets being provided with mounting holes, the latter aligned with threaded holes on the longitudinal edges of the side walls. Through this, the fastening of the cover plate and the bottom plate to the sides of the subrack is made possible in a simple manner.

Another considerable cost saving can be achieved if the cover plate and the bottom plate are designed to be identical.

A gap can be provided between the bent section and the narrow leg, whereby a closed channel of rectangular cross-section can be formed between the cover plate or the bottom plate and the angled strip. This considerably increases the rigidity of the front edges of the cover plate and the bottom plate that are provided with the angled strip. Their rear edges are provided with an additional bent section.

According to another feature of relevance to the invention, the cover part and the bottom part exhibit at their rear edges another angled strip as well as an extension that corresponds to that of the front face side.

It is particularly advantageous if the cover plate and the bottom plate are produced integrally with the cover part and the bottom part, respectively, and if the cover part as well as the bottom part exhibit at their rear edge another angled strip as well as an extension that corresponds to that of the front face side.

The invention is further explained in the following with the aid of the attached drawings. They show:

FIG. 1 a subrack according to the invention in a narrow embodiment form, in a perspective view, at approximately half scale;

FIG. 2 an integral bottom plate of the subrack according to FIG. 1;

FIG. 3 a bottom plate according to FIG. 2 and an associated angled strip, in an exploded view;

FIG. 4 a front comer of the bottom plate according to FIG. 2 and the angled strip, in an enlarged section according to "A" of FIG. 3.

The subrack 1 represented in FIG. 1 comprises two parallel side walls 2 and 3, a cover plate 4 and a cover part 5 as well as a bottom plate 6 and a bottom part 7 (not shown). All parts consist of corrosion-protected sheet steel of the same thickness of about a half millimeter.

The cover plate 4, the cover part 5, the bottom plate 6 and the bottom part 7 rest between the two side wall 2 and 3 and are fastened there with the aid of cap screws 8. The cover and the bottom of the subrack 1 are therefore in each case built of two parts. These four components of the subrack 1 are thus, in each case, identically designed. The bent fastening flanges 9 at the front side of the side walls 2 and 3 serve the mounting on a frame (not shown).

Both the cover plate 4 and the bottom plate 6 are equipped with a narrow bent section 10 at their front face sides—cf. FIG. 2—which stand at right angles to the plane of the cover plate 4 and the bottom plate 6. These bent sections exhibit a row of equidistant holes 11.

In FIGS. 2 to 4 an implementation form is reproduced in which the bottom plate 6 along with the bottom part 7 form a common integral component for the bottom of the subrack 1. The cover can also be designed in the same way.

Placed on the cover plate 4 and the bottom plate 6, in each case, is an angled strip 12 that lies parallel to the related bent section 10. This long angled strip 12, consisting of sheet steel, possesses a wide leg 13 and a narrow leg 14 that is bent at a right angle. The angled strip 12 extends over the total width of the cover plate 4 or the bottom plate 6—cf. FIG. 3.

Here the narrow leg 14 carries a row of threaded holes 15 that are aligned with the holes 11 the bent section 10.

The angled strip 12 is arranged so that the bent section 10 of the cover plate 4 or the bottom plate 6 rests with its longitudinal edge 16 at the inside 17 of the wide leg 13 (FIG. 2). At the same time, the narrow leg 14 of the angled strip 12 rests with its outer edge 18 at the outside 19 (cf. FIG. 1) of the cover plate 4 or the bottom plate 8, whereby a sharp edged corner is achieved.

Provision is made for connecting means 20 along the longitudinal edge 16 of the bent section 10 of the cover plate 4 and the bottom plate 6 as well as along the outer edge 18 of the narrow leg 14 of the angled strip 12.

As connecting means 20 a row of equidistant tines 21 protrude along the outer edge 18 of the narrow leg 14 of the angled strip 12 (cf. FIGS. 3 and 4), which tines engage a row of receptacles 22 in the cover plate 4 or the bottom plate 6. Corresponding to this, the bent section 10 of the cover plate 4 or the bottom plate 6 carries a second row of tines 21, which are pushed into a second row of receptacles 22, the latter being located in the wide leg 13 of the angled strip 12.

The row of tines 21 arranged facing the row of receptacles 22 are slightly displaced with respect to each other, i.e., about a fraction of a millimeter, whereby when putting together the angled strip 12 and the cover plate 4 or the bottom plate 6 a clamping connection is achieved. The tines 21 and the receptacles 22 possess rectangular cross-sections and provision is made for chamfers 23 at the heads of the tines 21 as an aid to insertion. Instead of the tines 21 and the receptacles 22 a suitable adhesive (not shown) can be considered.

The wide leg 13 of the angled strip 12 forms a projection 24 depicted as a roof (FIG. 1) in which provision is made for equidistant rectangular openings 25.

Both the cover plate 4 and the bottom plate 6 at their side edges exhibit brackets 26 protruding at right angles (see FIGS. 1 and 4) the brackets being provided with fastening holes 27, the latter being aligned with the screw holes 28 in the longitudinal edges of the side walls 2 and 3.

Provision is made for a gap 29 between the bent section 10 of the cover plate 4 and the bottom plate 6 on the one hand and the narrow leg 14 of the angled strip 12 on the other hand. Through this, a closed channel 30 is formed between the cover plate 4 or the bottom plate 6 and the angled strip 12, the channel having a rectangular cross-section.

The bottom plate 6 and the bottom part 7—cf. FIGS. 2 and 3—can be produced as an integral unit; the same holds true for the cover plate 6 and the cover part 7. Here the cover parts 5 and the bottom parts 7 likewise exhibit at their rear edges another bent section 31, which carry threaded holes 32 for fastening of plug/socket connectors and/or terminal strips, which are arranged on the backside of the subrack.

Four parallel rows of rectangular and circular holes and openings 33 serve the acceptance of fastening means at both ends for the guide rails (not shown).

Compilation of Reference Numerals 1. subrack
2. side wall
3. side wall
4. cover plate
5. cover part
6. bottom plate
7. bottom part
8. cap screws
9. mounting flange
10. bent section (of 4 and 6)
11. holes
12. angled strip
13. wide leg (of 12)
14. narrow leg (of 12)

15. threaded holes
16. longitudinal edge
17. inner side (of 13)
18. outer edge (of 14)
19. outer side (of 4 or 6)
20. connecting means
21. tines
22. receptacles
23. chamfers
24. protrusions
25. rectangular openings
26. brackets
27. fastening holes
28. screw holes (in 2 and 3)
29. gap
30. channel
31. bent section
32. threaded holes
33. holes and openings

What is claimed is:

1. A Subrack comprising:

two side walls, at least one cover plate, at least one bottom plate, whereby the cover plate and the bottom plate are fixed between the side walls, and the cover plate and the bottom plate exhibit a bent section protruding at a right angle, characterized by an angled strip is attached to the cover plate and the bottom plate parallel to the bent section, the angled strip includes a wide leg and a narrow leg bent at a right angle to the wide leg, the narrow leg has a row of threaded holes formed therein, the bent section rests with its longitudinal edge against the inner side of the wide leg, the narrow leg rests with its outer edge against one of the outer side of the cover plate or the bottom plate, the bent section includes a row of holes that are aligned with the threaded holes, connecting means along the longitudinal edge of the bent section and of the outer edge.

2. Subrack according to claim 1, wherein the cover plate, the bottom plate, and the angled strip comprise corrosion-protected sheet steel of the same thickness.

3. Subrack according to claim 1, wherein at least some of the holes are alignment holes.

4. Subrack according to claim 1, wherein the wide leg of the angled strip forms a projection including equidistant rectangular openings arranged in rows.

5. Subrack according to claim 1, wherein the as connecting means comprise a first row of tines protruding along the outer edge of the narrow leg, the tines engaging a first row of receptacles in one of the cover plate or the bottom plate.

6. Subrack according to claim 5, wherein the connecting means further comprises a second row of tines protruding along the bent section of the cover plate and the bottom, the second row of tines engaging a second row of receptacles in the wide leg of the angled strip.

7. Subrack according to claim 5, wherein the first row of tines is arranged slightly displace with respect to the row of receptacles.

8. Subrack according to claim 1, wherein the connecting means comprises an adhesive.

9. Subrack according to claim 1, wherein the cover plate and the bottom plate include at their side edges brackets projecting at a right angle, the brackets being provided with fastening holes that are aligned with the screw holes of the longitudinal edges of the side walls.

10. Subrack according to claim 1, wherein the cover plate and the bottom plate are identically designed.

11. Subrack according to claim 1, wherein a gap is formed between the bent section and the narrow leg, whereby a closed channel of rectangular cross-section is formed between the cover plate or the bottom plate and the angled strip.

12. Subrack according to claim 1, further comprising a cover part and a bottom part, wherein the cover part and the bottom part include at their rear edges another angled strip as well as an extension that corresponds to that of a front face side.

13. Subrack according to claim 1, further comprising a cover part and a bottom element, wherein the cover plate and the bottom plate are made integrally with the cover part and the bottom part, respectively, and the cover part and the bottom part include at their rear edges another angled strip as well as an extension that corresponds to that of a front face side.

* * * * *